United States Patent [19]

Manser et al.

[11] Patent Number: 5,399,963
[45] Date of Patent: Mar. 21, 1995

[54] METHOD AND APPARATUS FOR CALIBRATION OF AN ELECTRICITY METER

[75] Inventors: Beat Manser, Jona; Roland Nussbaumer, Uster, both of Switzerland

[73] Assignee: Zellweger Luwa AG, Uster, Switzerland

[21] Appl. No.: 818,675

[22] Filed: Jan. 9, 1992

[30] Foreign Application Priority Data

Jan. 9, 1991 [CH] Switzerland .................. 00037/91

[51] Int. Cl.$^6$ ............................................. G01R 1/04
[52] U.S. Cl. ............................. 324/74; 324/130; 324/115
[58] Field of Search ............... 200/16 E, 61.59; 324/175, 74, 731, 130, 115; 379/316

[56] References Cited

U.S. PATENT DOCUMENTS

| | | | |
|---|---|---|---|
| 477,091 | 4/1892 | Walker | 200/61.59 |
| 881,985 | 3/1908 | Wells | 200/16 E |
| 1,300,690 | 4/1919 | Bissell et al. | 324/175 |
| 2,908,866 | 10/1959 | Heiland et al. | 324/97 |
| 3,045,078 | 7/1962 | Franz et al. | 379/316 |
| 3,536,870 | 9/1970 | Izumi | 379/316 |
| 3,822,415 | 6/1974 | Deitch | 379/316 |
| 4,041,358 | 8/1977 | Donahue et al. | 361/365 |
| 4,810,989 | 3/1989 | Brandenberg et al. | 336/84 |
| 5,001,420 | 3/1991 | Germer | 324/142 |
| 5,128,611 | 7/1992 | Konrad | 324/142 |

FOREIGN PATENT DOCUMENTS

| | | |
|---|---|---|
| 0082082 | 6/1983 | European Pat. Off. |
| 0262293 | 4/1988 | European Pat. Off. |
| 0494427 | 7/1992 | European Pat. Off. |
| 2257972 | 6/1974 | Germany |

*Primary Examiner*—Kenneth A. Wieder
*Assistant Examiner*—Barry Bowser
*Attorney, Agent, or Firm*—Burns, Doane, Swecker & Mathis

[57] ABSTRACT

A meter provides an arrangement for the optional connection of its voltage circuit to a current path or to a calibration system. The arrangement includes an opening, provided in the housing of the meter for inserting a contact device connected to the calibration system, and a pivoting lever. On insertion of the contact device into the opening, the pivoting lever can be moved from an operating position, connecting the voltage circuit to the current path, into a calibration position connecting the voltage circuit to the calibration system. Consequently, the arrangement can be changed over between the operating position and the calibration position with a minimum possible cost.

6 Claims, 2 Drawing Sheets

METHOD AND APPARATUS FOR CALIBRATION OF AN ELECTRICITY METER

BACKGROUND OF THE INVENTION

The present invention relates to an electricity meter having a voltage circuit and a current path and having an arrangement for the optional connection of the voltage circuit to the current path or to a calibration system.

Arrangements of this type are required in the case of every electricity meter, since it is indeed known that every meter must be calibrated. One known arrangement of this type is formed by a fork-shaped short-circuiting link which is retained by two screw terminals, one of which is connected to the current path and another of which is connected to the voltage circuit of the meter. The short-circuiting links must be interrupted and displaced for the calibration process, in which a calibration voltage source of the calibration system is connected to the voltage circuit. Every calibration process thus requires a plurality of manipulations and hence requires a cost which is not inconsiderable and is undesired.

SUMMARY OF THE INVENTION

The invention is therefore directed to an electricity meter wherein the changeover of the arrangement between the current path and the calibration system is achieved with a minimum cost.

This object is achieved according to the invention by an arrangement which comprises an opening, provided in the housing of the meter for holding a contact device connected to the calibration system, and a pivoting lever which, on insertion of the contact device into the said opening, can be moved from an operating position, connecting the voltage circuit to the current path, into a calibration position connecting the voltage circuit to the calibration system.

In the case of the arrangement according to the invention, the calibration process requires merely that the contact device be plugged into the opening; that is the only manipulation required. A considerable reduction of the cost required for calibration is thus produced. Since the operation to be carried out for the changeover between the calibration position and the operating position in practice consists of only a single handle, complete automation of the calibration process is within the range of possibility, in that a contacting adaptor, for example, is used with a bolt-like contact device.

BRIEF DESCRIPTION OF THE DRAWINGS

The invention is explained in more detail in the following text on the basis of an exemplary embodiment and the drawings, in which.

DETAILED DESCRIPTION OF THE PREFERRED EMBODIMENTS

Figure 2:
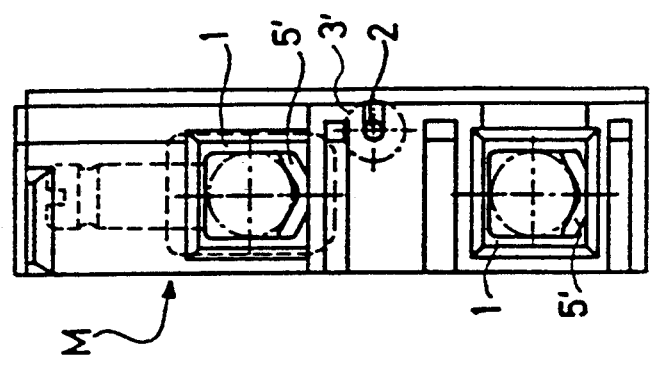
FIG. 2 shows a view in the direction of the arrow II in FIG. 1.
Figure 1:
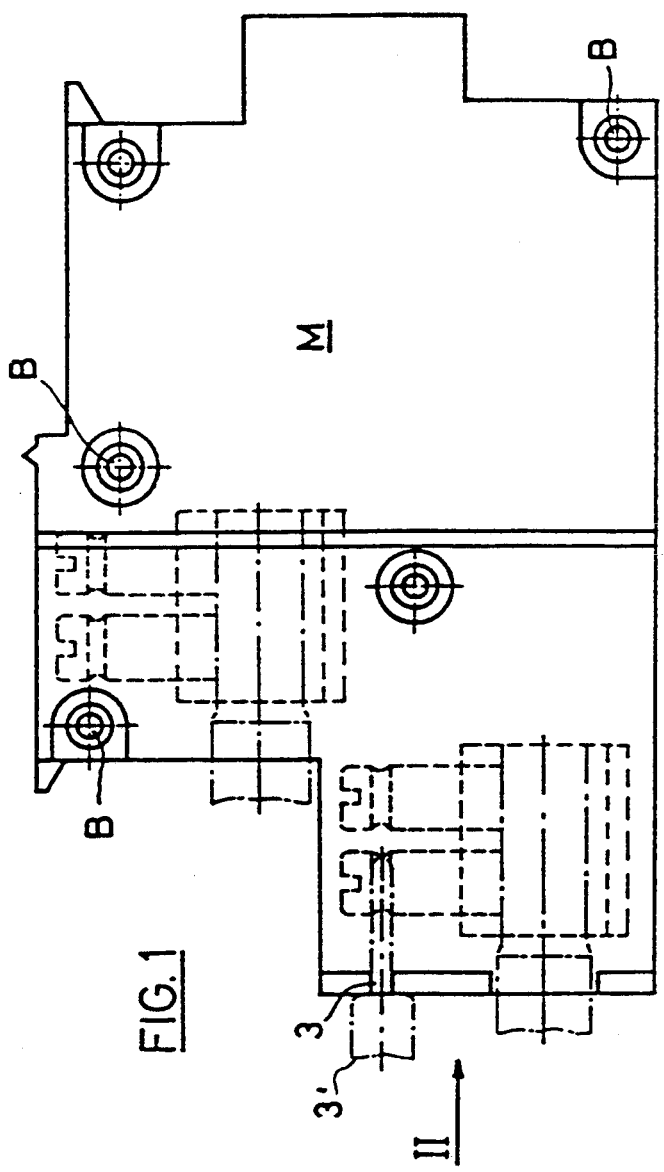
FIG. 1 shows a front view of a measuring cell of an electricity meter.
Figure 3:
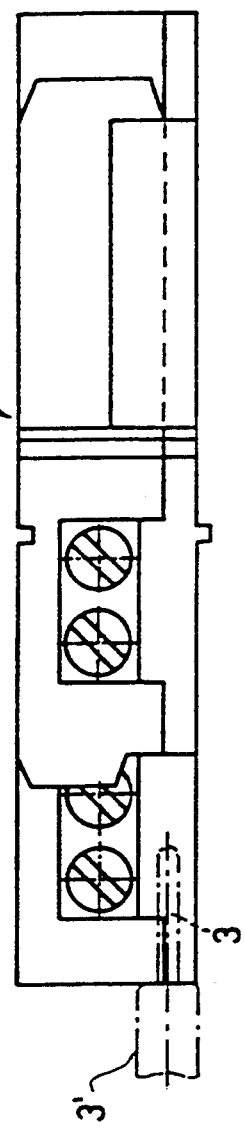
FIG. 3 shows a plan view of the measuring cell in FIG. 1.

FIGS. 1 to 3 show a measuring cell M of an electricity meter in three views, to a scale of 1.5:1. According to the representation, this measuring cell is formed as a flat box with the approximate dimensions $90 \times 60 \times 16$ millimeters, and it contains a measuring circuit for one phase of current to be measured. If this current is a three-phase alternating current, then the relevant electricity meter contains three such measuring cells M and a neutral conductor module of the same form, as a result of which a continuously modular construction and a uniform appearance of the electricity meter are achieved. Ribs and slots provided on the outer wall of the measuring cell M are used for centering the individual modules in the meter housing and with respect to one another; rivets for attachment of the housing cover are designated with the reference symbol B.

Every measuring cell M contains, in particular, two connecting terminals 1 of a current path which, according to the representation, are not arranged side-by-side, as was normal in the past, but one above the other. As a result, a significant reduction of the housing width is produced for a three-phase meter. The two connecting terminals 1 do not, of course, absolutely need to be aligned to one another; they can also be slightly offset with respect to one another. The essential feature is that they are located one above the other and not side-by-side. In this case, the mutual separation can be minimal since the two connecting terminals of the current path of one phase actually exhibit the same voltage and thus the minimum distance required to achieve the surge-withstanding capability specified between two phases is not necessary. When the connecting terminals are arranged one above the other, the cross-section of the connecting terminals can be selected to be significantly larger than in the past and it can thus be matched to the respective current intensity in wide limits.

As can be seen in particular from FIG. 2, in addition to the connecting terminals 1, the measuring cell M also has a connecting socket 2 for a pin or bolt 3 of a plug 3, like a banana plug. The operation of the connecting socket 2 and pin 3 is explained further connector with in the description of FIGS. 4 and 5.

Figure 4:
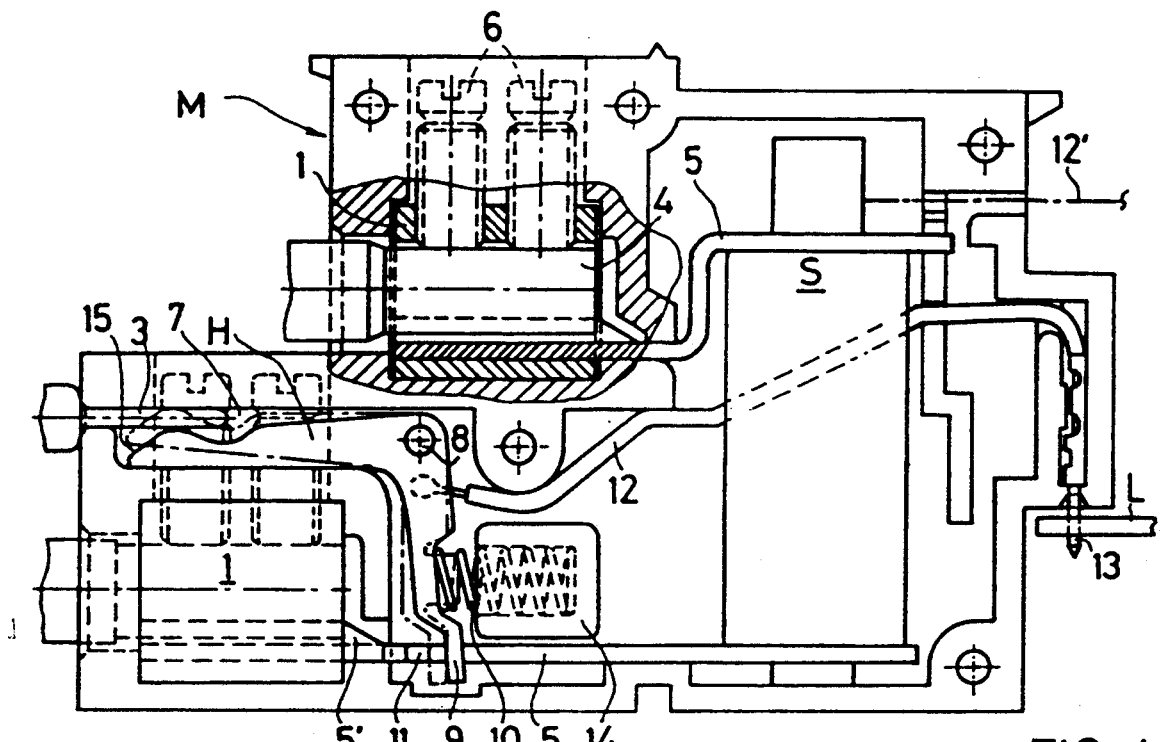
FIG. 4 shows a front view of the measuring cell with the housing cover removed.
Figure 5:
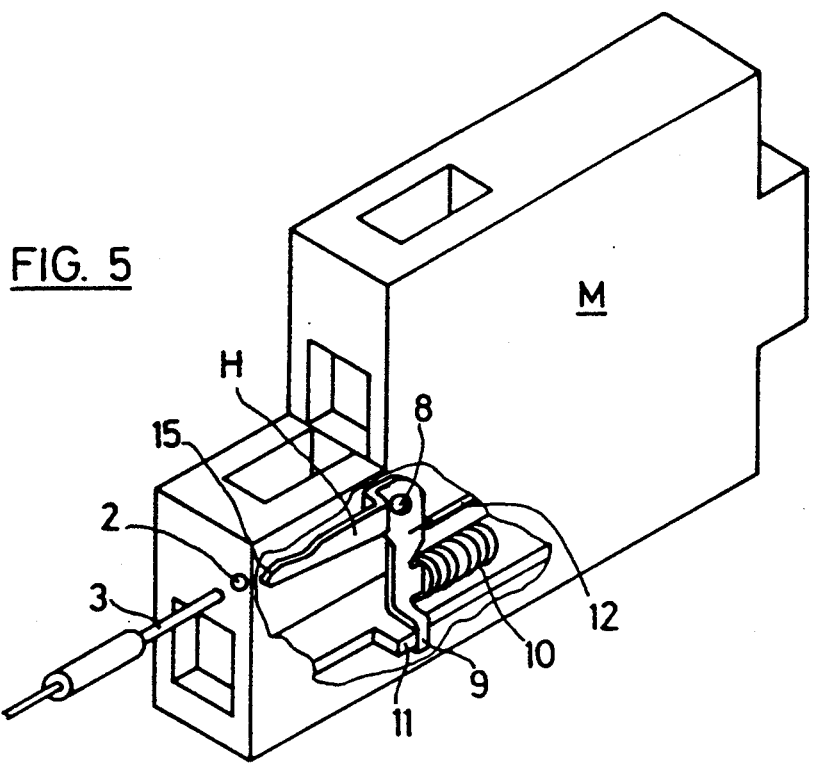
FIG. 5 shows a schematic perspective representation of a measuring cell in order to explain its operation.

FIG. 4 illustrates with a scale of 2:1 an exemplary embodiment of a front view of the measuring cell M with the housing cover removed, to a scale of 2:1, which measuring cell M is shown in partial cross-section in the region of the upper connecting terminal 1 in FIG. 1. FIG. 5 shows a schematic, partially cut-open perspective representation of the measuring cell M. FIG. 4 shows the measuring cell M with connecting wires 4 clamped firmly in the connecting terminals 1 and with pin 3 plugged into the socket 2. In FIG. 5, the pin 3 is not plugged into the socket 2. According to FIG. 4, there is a current sensor S connected to the connecting terminals 1 which does not, however, form an object of the present patent application and thus need not be described in greater detail here. An exemplary current sensor for use in FIG. 4 is described in Swiss Patent Application No. 03672/91-1 filed Dec. 13, 1991. The current sensor S contains, inter alia, a current bracket, formed by a flat conductor, which has two busbars 5 leading to the connecting terminals 1. The busbars 5 are designed, in the region of the connecting terminals 1, in the form of a trough 5' (see also FIG. 2), into which the respective connecting wire 4 is inserted and is clamped firmly by screws 6. The connecting terminals 1 are fixed in corresponding recesses of the housing of the measuring cell M.

The already-mentioned pin or bolt 3 is connected to the voltage source of a calibration system and is used for the calibration of the electricity meter which calibration is as specified and mandatory for every measuring cell M. In the case of this calibration, the pin 3 is pushed into the socket 2 and a connection is thus produced between the said calibration system and the voltage circuit of the electricity meter, which voltage circuit is connected, in the operating state of the meter, to the meter's current path, that is to say to one of the busbars 5. The voltage circuit is symbolized in FIG. 4 by a printed-circuit board L.

FIG. 4 shows the measuring cell during calibration, that is to say with the pin 3 inserted into the socket 2. According to the representation, the socket 2 turns into a depression 7 inside the housing, in which an angled pivoting lever H is arranged, supported on a rotating shaft 8. The lower end, in FIGS. 4 and 5, of the pivoting lever H is designed as a contact part 9 which, in the operating state of the meter, that is to say with the pin 3 not plugged in (FIG. 5), is pressed by a spring 10 against a cam 11 which projects laterally from the busbar 5 located on the lower connecting terminal 1. Consequently, in the operating state of the meter, with the position of the pivoting lever H as indicated with dotted-and-dashed lines in FIG. 4, a connection to the voltage circuit of the measuring cell M (printed-circuit board L) is produced from the 10 lower busbar 5, via the cam 11, the pivoting lever H, a flexible wire 12 which is attached to the pivoting lever H and is conductively connected thereto, and a plug 13.

With respect to FIG. 4, above the printed-circuit board L in contact with a wire 12' there is arranged a second printed-circuit board which contains the electronics for evaluating the signals of the current sensor S. These signals are passed to the exterior via a wire symbolized by a dotted-and-dashed line 12'. As can be seen, the two wires 12 and 12' cross one another approximately at a right angle, at which the mutual influence of the signals of the two wires is minimal.

The compression spring 10, which presses the contact part 9 of the pivoting lever H against the cam 11, is held in a mounting 14 of the measuring cell housing and is electrically insulated. The compression spring 10 is fixed on the pivoting lever H on a projection provided with grooves or with another means of attachment.

In the region of the end of its horizontal arm which is located in the path of the pin 3 when the latter is pushed into the socket 2, the pivoting lever H has an operating surface 15, which runs obliquely with respect to the longitudinal axis of the pin 3 and crosses the latter, against which operating surface 15 the pin 3 presses when it is pushed into the socket 2. In consequence, the pivoting lever H is pivoted out of its operating position, which is indicated with dotted-and-dashed lines in FIG. 4, into the calibration position, indicated with solid lines, in which the contact 10 between the cam 11 and the pivoting lever end 9, and hence between the busbar 5 and the voltage circuit L of the measuring cell, is interrupted. For this purpose, an electrical connection exists via the pivoting lever H between the pin 3, and hence the calibration system, and the voltage circuit of the measuring cell of the electricity meter.

The described arrangement for the optional connection of the voltage circuit to the current path or to the calibration system, which consists of the socket 2 and of the pivoting lever H, simplifies the cost for changing over from an operating state to a calibration state, and vice versa, quite significantly, in that the said arrangement reduces the actions required for this purpose to plugging one plug into a socket and to its removal therefrom.

This invention may be embodied in several forms without departing from the spirit of essential characteristics thereof. The present embodiment is therefore considered illustrative and not restrictive. The scope of the invention is defined by the appended claims rather than by the description preceding them, and all changes that fall within the meets and bounds of the claims, or equivalence of such meets and bounds thereof are therefore intended to be embraced by the claims.

What is claimed is:

1. Apparatus for calibrating an electricity measuring circuit comprising:
    a housing having a socket for receiving a calibration system contact pin;
    a current sensor mounted within the housing;
    at least two connecting terminals for providing a supply of current to said current sensor;
    a voltage circuit for receiving current from at least one of said connecting terminals;
    a pivoting lever supported in said housing between said socket, said at least one connecting terminal and said voltage circuit, and having first and second operating positions, said first operating position of said pivoting lever establishing electrical contact between said at least one connecting terminal and said voltage circuit, and said second operating position of said pivoting lever establishing electrical contact between said calibration system contact pin inserted into said socket and said voltage circuit; and
    a rotating shaft about which said pivoting lever pivots when said calibration system contact pin is inserted into said socket, thereby pivoting said pivoting lever from said first operating position into said second operating position for electrically connecting said calibration system contact pin to said voltage circuit.

2. Apparatus according to claim 1, further including:
    a first wire for connecting said pivoting lever to said voltage circuit; and
    a second wire for connecting said current sensor to a current evaluating circuit, said first and second wires crossing one another at an approximately right angle.

3. Apparatus according to claim 1, wherein said pivoting lever further includes:
    two lever arms, one lever arm establishing electrical contact of said pivoting lever to said at least one connecting terminal, and the other lever arm of said pivoting lever establishing electrical contact of said pivoting lever to said calibration system contact pin when said pivoting lever is in said second operating position.

4. Apparatus according to claim 3, further including:
    a spring for biasing said pivoting lever into said first operating position.

5. Apparatus according to claim 4, wherein said two arms of said pivoting lever form an L-shape, with said rotating shaft being positioned at a location of said L-shaped pivoting lever where said two arms meet.

6. Apparatus according to claim 5, wherein said spring is a compression spring fixed to a projection of said pivoting lever, said projection being provided with grooves for attachment to said compression spring.

* * * * *